United States Patent
Van Sinderen et al.

(10) Patent No.: US 7,961,827 B2
(45) Date of Patent: Jun. 14, 2011

(54) SIGNAL PROCESSING ARRANGEMENT COMPRISING A FILTER

(75) Inventors: Jan Van Sinderen, Cambes en Plaine (FR); Marc Godfriedus Marie Notten, Eindhoven (NL)

(73) Assignee: NXP B.V., Eindhoven (NL)

( * ) Notice: Subject to any disclaimer, the term of this patent is extended or adjusted under 35 U.S.C. 154(b) by 1223 days.

(21) Appl. No.: 11/628,908

(22) PCT Filed: May 25, 2005

(86) PCT No.: PCT/IB2005/051709
§ 371 (c)(1),
(2), (4) Date: Dec. 7, 2006

(87) PCT Pub. No.: WO2005/122394
PCT Pub. Date: Dec. 22, 2005

(65) Prior Publication Data
US 2008/0013656 A1      Jan. 17, 2008

(30) Foreign Application Priority Data
Jun. 7, 2004   (EP) .................................. 04102565

(51) Int. Cl.
*H04B 1/10*     (2006.01)
(52) U.S. Cl. ........ 375/350; 375/346; 455/302; 455/323; 455/326; 455/266; 455/307; 333/174; 333/12
(58) Field of Classification Search .................. 375/346, 375/350; 455/302, 323, 326, 266, 307; 333/174, 333/12
See application file for complete search history.

(56) References Cited

U.S. PATENT DOCUMENTS

| | | | |
|---|---|---|---|
| 4,647,843 A | 3/1987 | Gawargy | |
| 4,791,379 A | 12/1988 | Hughes et al. | |
| 5,982,228 A * | 11/1999 | Khorramabadi et al. | 327/553 |
| 5,982,450 A | 11/1999 | Nakamura | |
| 5,982,832 A * | 11/1999 | Ko | 375/371 |
| 6,930,565 B1 * | 8/2005 | Vishinsky | 333/17.1 |
| 6,985,710 B1 * | 1/2006 | Margairaz et al. | 455/302 |
| 7,860,478 B2 * | 12/2010 | Lim et al. | 455/307 |
| 2003/0222729 A1 * | 12/2003 | Wong | 333/17.1 |

(Continued)

FOREIGN PATENT DOCUMENTS

| | | |
|---|---|---|
| CN | 1184395 A | 6/1998 |
| EP | 1 271 779 | 1/2003 |

OTHER PUBLICATIONS

Khorramabadi, H., "Baseband Filters for IS-95 CDMA Receiver Applications Featuring Digital Automatic Frequency Tuning", Feb. 1996, IEEE International Solid State Circuit Conf., vol. 39 pp. 172, 173, 439.*

(Continued)

*Primary Examiner* — Shuwang Liu
*Assistant Examiner* — Sung Ahn

(57) ABSTRACT

A signal processing arrangement (REC) comprises a filter (PPF) with variable filter elements (FE). A switching circuit (SWCT) switches a filter element (FE1) and, subsequently, another filter element (FE3) from a filter state to an adjustment state and back again to the filter state. A filter element that is in the filter state contributes to a suppression of unwanted signals. A filter element that is in the adjustment state affects a characteristic of a measurement signal (Sm). An adjustment circuit (ADCT) adjusts the filter element that is in the adjustment state so that the characteristic of the measurement signal is substantially equal to a target value (TV).

9 Claims, 13 Drawing Sheets

U.S. PATENT DOCUMENTS

2004/0116069 A1* 6/2004 Fadavi-Ardekani et al. 455/3.02
2004/0116096 A1* 6/2004 Shen ............................. 455/323
2004/0214533 A1* 10/2004 Khorram ....................... 455/118

OTHER PUBLICATIONS

Khorramabadi H et al: "Baseband Filters for IS-95 CDMA Receiver Applications Featuring Digital Automatic Frequency Tuning" IEEE International Solid State Circuits Conf.; IEEE Inc. N.Y. US; vol. 39; Feb. 8, 1996.

Sanderson, D.I., et al. "5-6 GHz S1Ge VCO with Tunable Polyphase Output for Analog Image Rejection and I/Q Mismatch Compensation", 2003 IEEE MTT-S Int'l. Microwave Symposium Digest, vol. 3 of 3, pp. a169-a172 (Jun. 2003).

* cited by examiner

SIGNAL PROCESSING ARRANGEMENT COMPRISING A FILTER

FIELD OF THE INVENTION

The invention relates to a signal processing arrangement that comprises a filter for suppressing unwanted signals. The signal processing arrangement may be, for example, a receiver for receiving a radio frequency signal that conveys information in the form of audio, video, or data or any combination of those.

BACKGROUND OF THE INVENTION

A receiver may be implemented in the following manner. A frequency converter converts a radio frequency signal into an intermediate frequency signal that comprises two components: an in-phase component and a quadrature component. A so-called polyphase filter filters the intermediate frequency signal so as to suppress unwanted signals. The filtered intermediate frequency signal is further processed so as to obtain information that is conveyed by the radio frequency signal.

The extent to which the polyphase filter suppresses unwanted signals depends on the relative accuracy of the components that constitute the polyphase filter. The higher the relative accuracy is, the better the unwanted signals are suppressed.

U.S. Pat. No. 4,647,843 describes a polyphase filter that consists of a ring of series connected alternate resistors and capacitors. The polyphase filter has junction points between the resistors and capacitors that alternately form inputs and outputs of the filter. The resistors are trimmed so that a product of the resistance and the capacitance of the component connected to each respective output is equal to a product RC, R and C being the nominal resistance and capacitance of the resistors and capacitors. In order to manufacture the polyphase filter at a relatively low cost, thick film techniques are used. The resistors of each network section are trimmed to the desired value after they have been formed on a thick film substrate. The resistors are trimmed using a laser in a known manner.

SUMMARY OF THE INVENTION

According to an aspect of the invention, a signal processing arrangement that comprises a filter with various filter elements has the following characteristics. A switching circuit switches a filter element and, subsequently, another filter element from a filter state to an adjustment state and back again to the filter state. The filter element contributes to a suppression of unwanted signals in the filter state. The filter element affects a characteristic of a measurement signal in the adjustment state. An adjustment circuit adjusts the filter element that is in the adjustment state so that the characteristic of the measurement signal is substantially equal to a target value.

The invention takes the following aspects into consideration. In practice, an adjustment circuit has a certain inaccuracy like any other circuit. Consequently, the adjustment circuit in the signal processing device in accordance with the invention will introduce a certain error. That is, the filter element that is in the measurement state will not be adjusted so that the relevant characteristic of the measurement signal is exactly equal to the target value. There will be a certain discrepancy due to inaccuracies within the adjustment circuit.

However, in the signal processing arrangement in accordance with the invention, any inaccuracy of the adjustment circuit will affect an adjustment of one filter element to substantially the same extent as an adjustment of another filter element. That is, the adjustment circuit will introduce substantially the same error in each adjustment that is carried out. Consequently, the respective values of the one and the other filter element will closely match after the adjustment in accordance with invention has been carried out, although the respective values as such may not be very precise. Close matching of filter elements within, for example, a polyphase filter contributes to the adequate suppression of unwanted signals. Consequently, an advantage of the invention is that it allows a relatively good quality of signal processing.

Another advantage of the invention relates to the following aspects. A signal processing arrangement in accordance with the invention does not require any trimming of filter elements by means of, for example, a laser. Such trimming requires a relatively substantial amount of time and may therefore slow down a production process, which reduces production capacity in terms of number units produced per hour or day. To circumvent that, a production line may comprise various trimming stations. However, this will make the production line more costly. Since the invention does not require any trimming of filter elements, the invention allows a reduction of cost.

Furthermore, a signal processing arrangement in accordance with the invention can be implemented in the form of an integrated circuit or a set of integrated circuits. Integrated circuits are relatively cheap. What is more, a signal processing arrangement in accordance with the invention does not require a relatively large chip surface. The reason for this is that the filter elements do not need to be relatively accurate in terms of component value. Since the filter elements do not need to be relatively accurate, they can be realized on a relatively small chip surface. In addition, the switching circuit and the measurement circuit can also be realized on a relatively small chip surface. For those reasons, the invention allows cost efficient implementations.

In addition, the invention allows yield improvement: a higher percentage of integrated circuits, which are mass produced, will have a satisfactory performance compared with conventional implementations. The reason for this is that the performance of an implementation in accordance with the invention depends less on relative component accuracy than a conventional implementation. Consequently, an implementation in accordance with the invention may have a satisfactory performance for a certain relative component accuracy, whereas a conventional implementation does not have a satisfactory performance for the same relatively component accuracy. The implementation in accordance with the invention will pass the OK test, whereas the conventional implementation will not pass the OK test, which represents an economic loss. Yield improvement is a thus yet another reason for which the invention allows cost efficient implementations.

These and other aspects of the invention will be described in greater detail hereinafter with reference to drawings.

DETAILED DESCRIPTION

Figure 1:
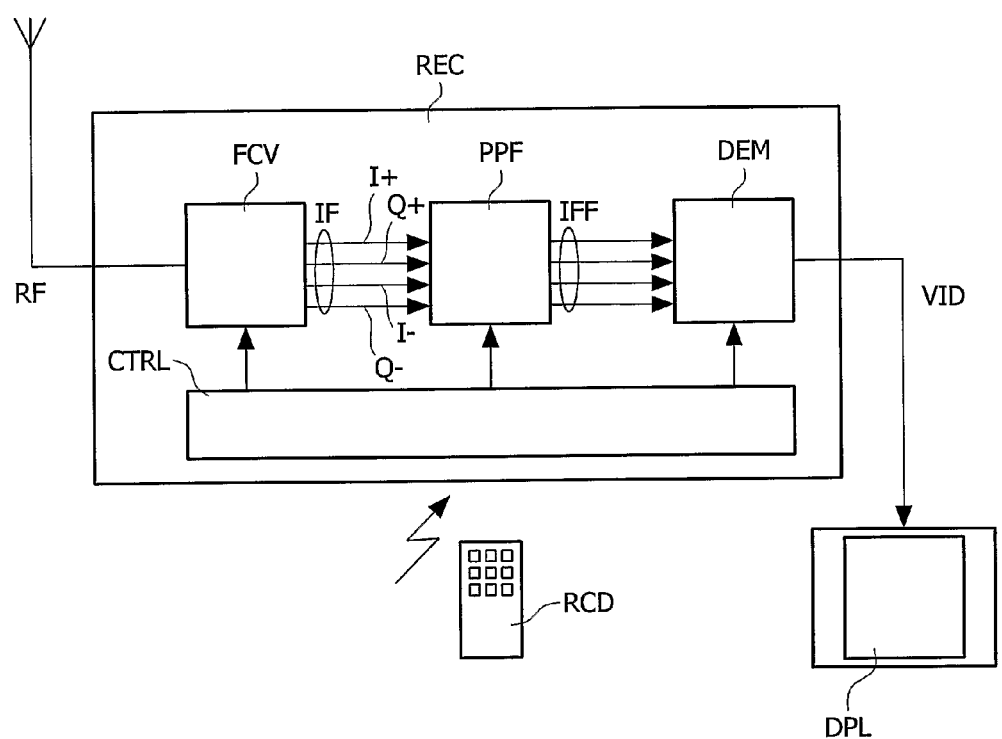
FIG. 1 is a block diagram that illustrates a receiver.

FIG. 1 illustrates a receiver REC that receives a radiofrequency signal RF and provides in response thereto a video signal VID for display on a display device DPL. The receiver REC comprises a frequency converter FCV, a polyphase filter PPF, a demodulator DEM, and a controller CTRL. The controller CTRL may interact, for example, with a remote-control RCD.

The receiver REC operates as follows. The frequency converter FCV converts the radiofrequency signal RF into an intermediate frequency signal IF. The polyphase filter PPF filters the intermediate frequency signal IF so as to obtain a filtered intermediate frequency signal IFF. The demodulator DEM further processes the filtered intermediate frequency signal IFF and derives therefrom the video signal VID to be displayed on the display device DPL.

The intermediate frequency signal IF within the receiver REC is a complex signal that has an in-phase component I and a quadrature component Q. The in-phase component and the quadrature component are in a differential form. Accordingly, the intermediate frequency signal IF comprises a positive in-phase component I+, a positive quadrature component Q+, a negative in-phase component I−, and a negative quadrature component Q−. These components can be represented as 0, 90, 180, 270 degree phase components, respectively. Frequency converters that provide such a complex intermediate frequency signal are typically implemented with various mixers. Such frequency converters also include phase shifters that phase shift an oscillator signal before it is applied to the respective mixers.

The polyphase filter PPF distinguishes between positive and negative frequencies within the complex intermediate frequency signal IF. That is, the polyphase filter PPF can suppress a negative or a positive frequency whereas the frequency of opposite sign is not suppressed. The polyphase filter PPF has, for example, a pass band that ranges from zero frequency to a positive cut off frequency. The positive cut off frequency substantially corresponds to the band width of the radiofrequency signal RF to be received. Negative frequencies are suppressed, in particular negative frequencies that are just below zero frequency.

Figure 2:
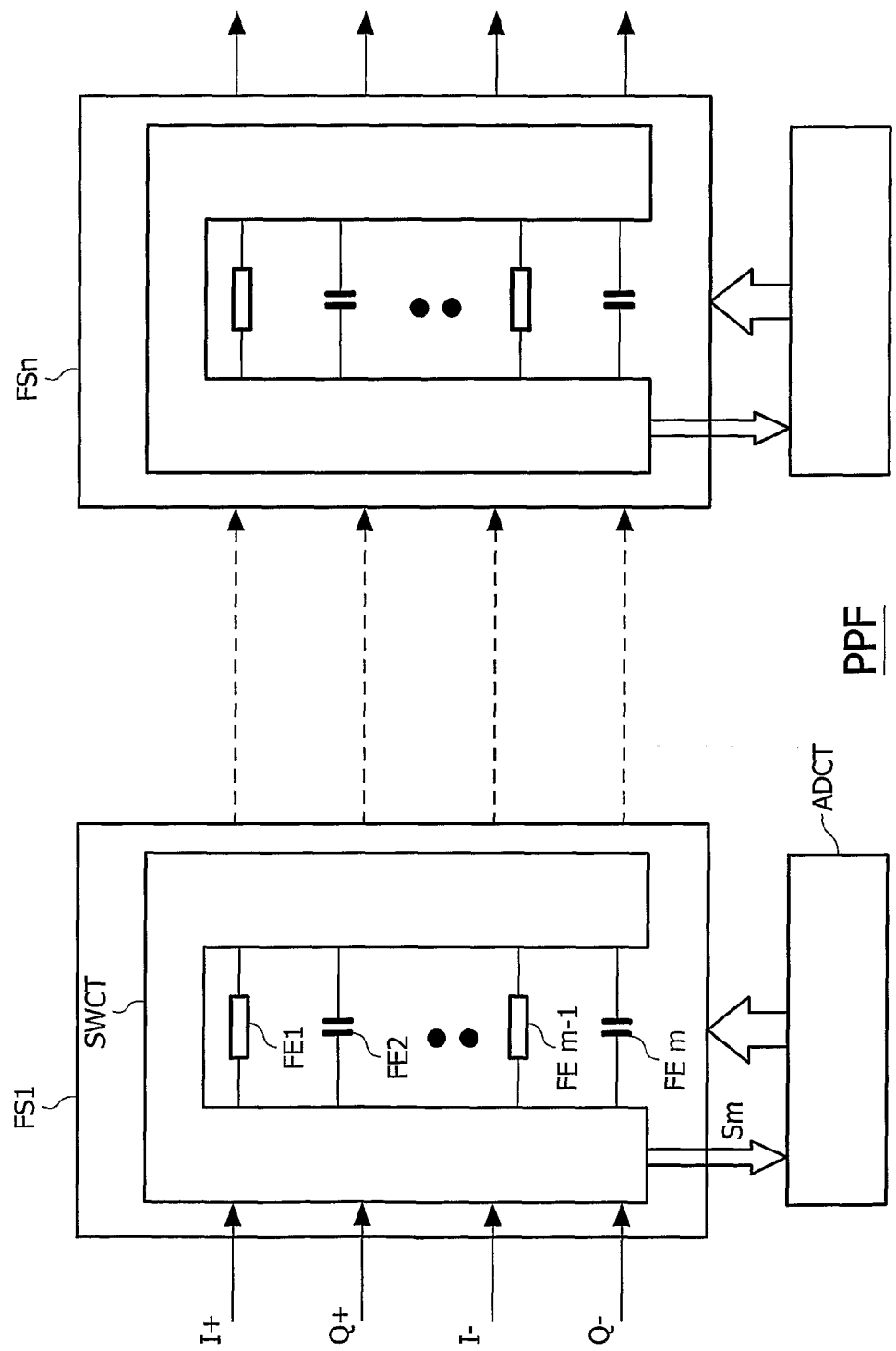
FIG. 2 is a block diagram that illustrates a polyphase filter within the receiver.

FIG. 2 illustrates the polyphase filter PPF of the receiver REC shown in FIG. 1. The polyphase filter PPF comprises a filter input section FS1 and an adjustment circuit ADCT. The filter input section FS1 comprises various filter elements FE1, FE2, . . . , FEm-1, and FEm, and a switching circuit SWCT. The filter input section FS1 receives the four components of the intermediate frequency signal IF. The polyphase filter PPF may comprise additional filter sections FS1, . . . , FSn as illustrated in FIG. 2. Those additional filter sections may be similar to the filter input section FS1. The polyphase filter PPF may comprise various amplifiers, which are not shown in FIG. 2. For example, amplifiers that constitute buffers may precede the filter input section FS1. Such buffer amplifiers may also be coupled between two successive filter sections within the polyphase filter PPF.

The polyphase filter PPF basically operates as follows. The switching circuit SWCT applies a measurement signal Sm to the adjustment circuit ADCT. The switching circuit causes one or more filter elements FE to affect a characteristic of the measurement signal Sm. The adjustment circuit ADCT adjusts the one or more filter elements FE that affect the characteristic of the measurement signal Sm.

Figure 3:
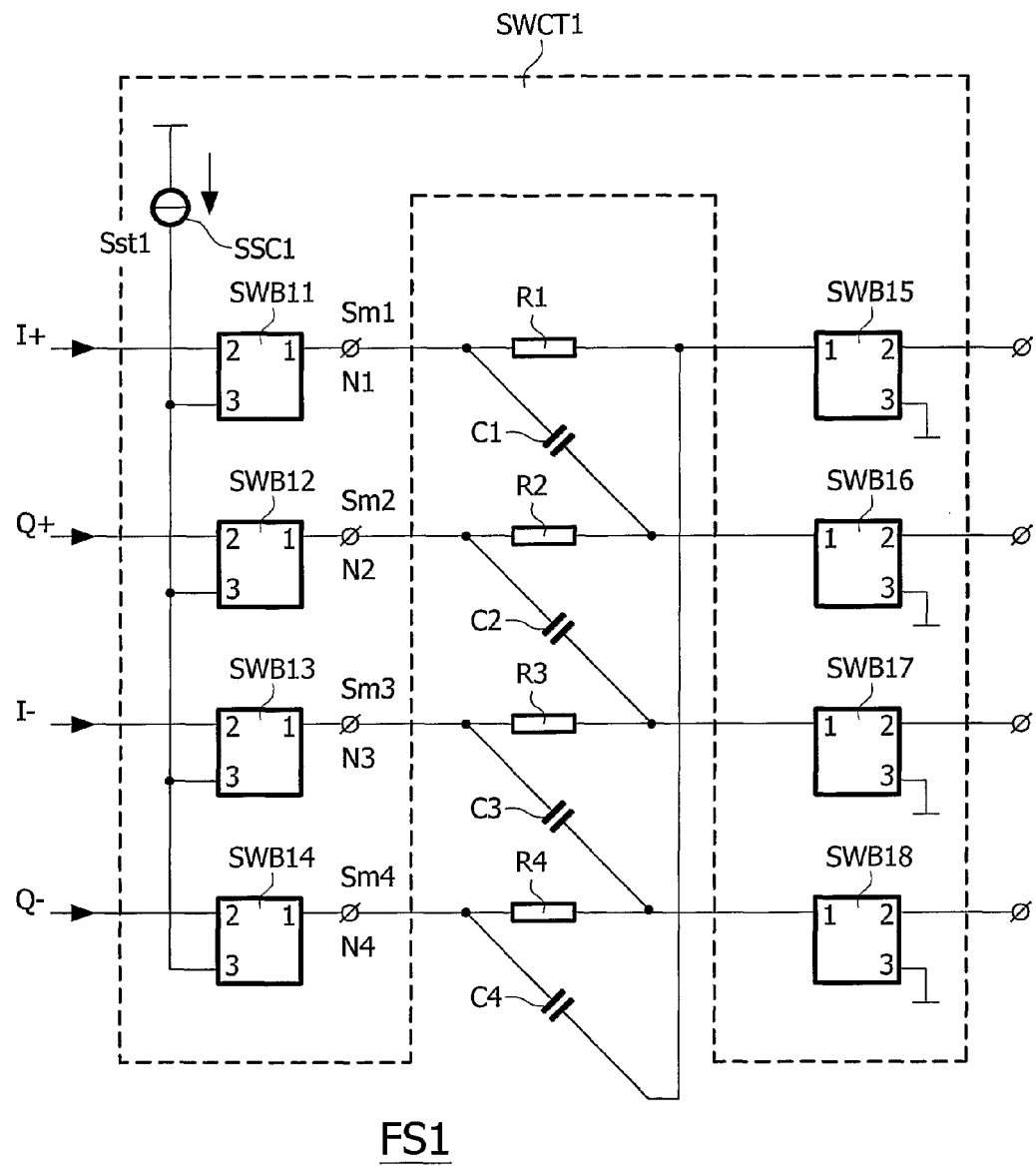
FIG. 3 is a circuit diagram that illustrates a filter input section of the polyphase filter.

FIG. 3 illustrates the filter input section FS1. The filter input section FS1 comprises four resistors R1, R2, R3, and R4 and four capacitors C1, C2, C3, and C4 that constitute filter elements. The filter input section FS1 farther comprises a switching circuit SWCT1, which includes eight switch blocks SWB11, SWB12, . . . , SWB18 and a stimulus signal source SSC1. The stimulus signal source SSC1 provides a stimulus signal Sst1 that may be an AC signal, a DC signal or a combination of both signals. The filter input section FS1 comprises four measurements nodes N1, N2, N3, and N4, each node being coupled to a resistor R and the capacitor C.

The eight switch blocks SWB11, SWB12, . . . , SWB18 are similar. A switch block SWB has three contacts designated by numerals 1, 2, and 3. A switch block SWB has two switch states: a filter switch state in which contact 1 is connected with contact 2, and a measurement switch state in which contact 1 is connected with contact 3. The switch blocks SWB are normally in the filter switch state and exceptionally in the measurement switch state.

The filter input section FS1 operates as follows. Let it be assumed that each switch block SWB is in the filter switch state. In that case, each filter element contributes to a suppression of unwanted signals that may be present in the intermediate frequency signal. That is, each resistor R and each capacitor C is in a filter state.

Let it now be assumed, that switch blocks SWB11, SWB15, and SWB16 are in the measurement switch state and that the other switch blocks are in the filter switch state. In that case, resistor R1 and capacitor C1 receive the stimulus signal St1. A measurement signal Sm1 will appear on measurement node N1. The measurement signal Sm1 will have an amplitude that is defined, amongst other things, by resistor R1 and capacitor C1. The switching arrangement SWCT1 thus causes the resistor R1 and C1 to be in a measurement state when switch blocks SWB11, SWB15, and SWB16 are the measurement switch state.

Let it now be assumed, that switch blocks SWB12, SWB16, and SWB17 are the measurement switch state and that the other switch blocks are in the filter switch state. In that case, resistor R2 and capacitor C2 receive the stimulus signal St1. A measurement signal Sm2 will appear on measurement node N2. The measurement signal Sm2 will have an amplitude that is defined, amongst other things, by resistor R2 and capacitor C2. The switching arrangement SWCT1 thus causes the resistor R2 and C2 to be in a measurement state when switch blocks SWB12, SWB16, and SWB17 are the measurement switch state.

In a similar fashion, the switching arrangement SWCT1 causes the resistor R3 and C3 to be in a measurement state when switch blocks SWB13, SWB17, and SWB18 are the measurement switch state. A measurement signal Sm3 on measurement node N3 will have an amplitude that is defined, amongst other things, by resistor R3 and capacitor C3. The switching arrangement SWCT1 causes the resistor R4 and C4 to be in a measurement state when switch blocks SWB14, SWB18, and SWB15 are the measurement switch state. A measurement signal Sm4 on measurement node N4 will have an amplitude that is defined, amongst other things, by resistor R4 and capacitor C4.

Figure 4:
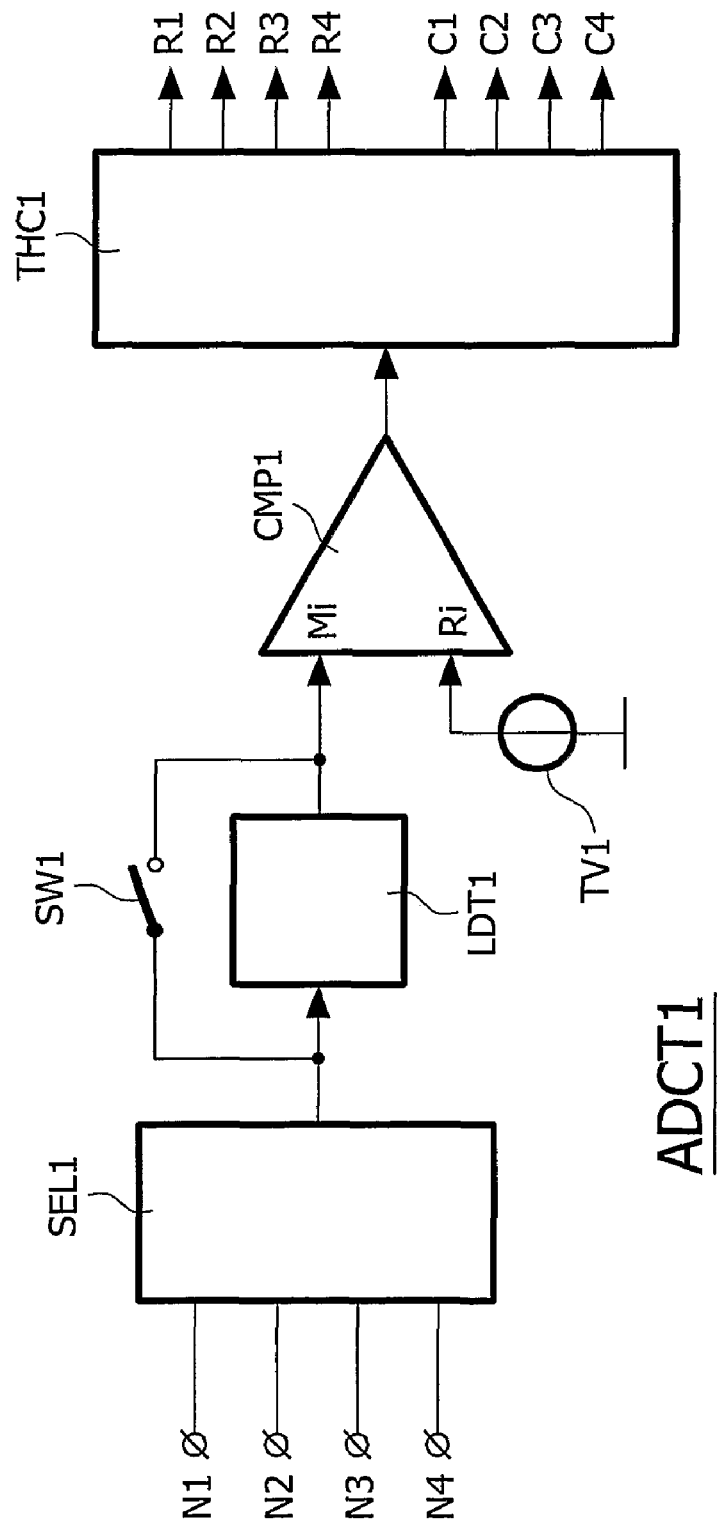
FIG. 4 is a circuit diagram that illustrates an adjustment circuit for the filter input section.

FIG. 4 illustrates an adjustment circuit ADCT1 for the filter elements of the filter input section FS1 shown in FIG. 3. The adjustment circuit ADCT1 comprises a selector SEL1, a level detector LDT1, a basic switch SW1, a comparator CMP1, and a track-and-hold control circuit THC1. The basic switch SW1 is coupled in parallel to the level detector LDT1. The basic switch SW1 can be switched between an open state and a closed state. The comparator CMP1 has a measurement input Mi and a reference input Ri. The reference input Ri receives a target value TV1. The track-and-hold control circuit THC1 is coupled to the filter elements of the polyphase filter and can adjust each filter element individually.

The adjustment circuit ADCT1 operates as follows. The selector SEL1 selects one of the measurement nodes N in the filter input section FS1. The basic switch SW1 is switched to the closed state when the stimulus signal source SSC1 provides a DC signal. In that case, the comparator CMP1 receives at its measurement input Mi the measurement signal that is present on the measurement node that the selector SEL has selected. The basic switch SW1 is switched to the open state when the stimulus signal source SSC1 provides an AC signal. In that case, the level detector LDT1 provides a level detection value to the measurement input Mi of the comparator CMP1. The level detection value represents the amplitude of the measurement signal that is present on the measurement node that the selector SEL has selected.

The comparator CMP1 compares the signal received at its measurement input Mi with the target value TV1. In response, the comparator CMP1 applies an adjustment signal to the track-and-hold control circuit THC1. The track-and-hold control circuit THC1 adjusts a filter element that is coupled to the measurement node N. Let it be assumed, for example, that the selector SEL1 selects measurement node N1. Resistor R1 and capacitor C1 are coupled to measurement node N1. In that case, the track-and-hold control circuit THC1 may adjust resistor R1 or capacitor C1, or both filter elements. There are various manners to adjust the filter elements, which will be described in the end of the description.

Figure 5:
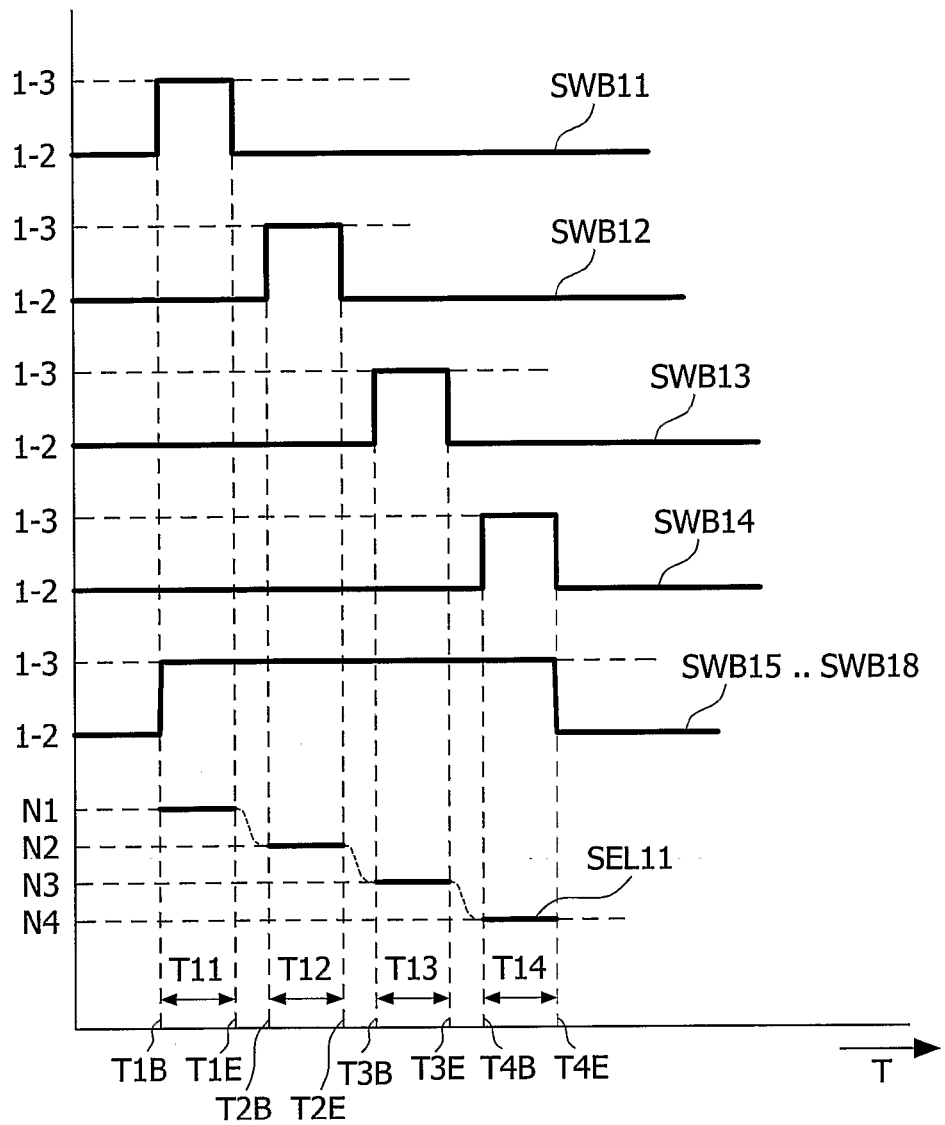
FIG. 5 is a time diagram that illustrates the operation of the filter input section.

FIG. 5 illustrates a method of adjusting the filter elements in the filter input section FS1 by means of the switching circuit SWCT1 illustrated in FIG. 3 and the adjustment circuit ADCT1 illustrated in FIG. 4. FIG. 5 is a time diagram which shows the respective states of the switch blocks SWB present in the switching circuit SWCT1 and the state of the selector SEL1 in the adjustment circuit ADCT1. The reference sign 1-2 denotes that contact 1 and contact 2 of the relevant switch block SWB are connected. In that case, the switch block SWB is in the filter switch state. The reference sign 1-3 denotes that contact 1 and contact 3 of the relevant switch block SWB are connected. In that case, the switch block SWB is in the measurement switch state.

FIG. 5 illustrates that switch block SWB11 is switched from the filter switch state to the measurement switch state at time T1B. Switch block SWB11 is switched back again to filter switch state at time T1E. Consequently, switch block SWB11 is in the measurement switch state during a time interval TI1 that begins at time T1B and that ends at time T1E. FIG. 5 further illustrates that switch blocks SWB12, SWB13, and SWB14 are switched from the filter switch state to the measurement switch state at times T2B, T3B, and T4B, respectively. Switch blocks SWB12, SWB13, and SWB14 are switched back again to filter switch state at times T2E, T3E, and T4E, respectively. Consequently, switch blocks SWB12, SWB13, and SWB14 are in the measurement switch state during times intervals TI2, TI3, and TI4, respectively. Switch blocks SWB15, . . . , SWB18 are switched from the filter switch state to the measurement switch state at time T1B. Switch blocks SWB15, . . . , SWB18 are switched back again to the filter switch state at time T4E. Consequently, switch blocks SWB15, . . . , SWB18 are in the measurement switch state during the times intervals TI1, TI2, TI3, and TI4. FIG. 5 further illustrates the selector SEL shown in FIG. 4 selects measurement nodes N1, N2, N3, and N4 during time intervals TI1, TI2, TI3, and TI4 respectively.

Let it be assumed that the stimulus signal source SSC1 provides a DC signal. During time interval TI1, a DC signal will be present on measurement node N1 whose value is determined by resistor R1. That is, resistor R1 is in the measurement state during time interval TI1. The adjustment circuit ADCT1 illustrated in FIG. 4 adjusts resistor R1 so that the DC signal present on measurement node N1 will substantially be equal to the target value TV1. In more detail, during time interval TI1, the track-and-hold control circuit THC1 adjusts resistor R1 on the basis of the adjustment signal that it receives from the comparator CMP1. That is, during time interval TI1, the track-and-hold control circuit THC1 adjusts resistor R1 so that it has a resistance for which the DC signal at the measurement input Mi of comparator CMP1 is substantially equal to the target value TV1. The track-and-hold control circuit THC1 maintains this resistance of resistor R1 after time interval TI1 until resistor R1 is adjusted anew.

During time interval TI2, a DC signal will be present on measurement node N2 whose value is determined by resistor R2. That is, resistor R2 is in the measurement state during time interval TI2. The adjustment circuit ADCT1 illustrated in FIG. 4 adjusts resistor R2 so that the DC signal present on measurement node N2 will substantially be equal to the target value TV1. In more detail, during time interval TI2, the track-and-hold control circuit THC1 adjusts resistor R2 on the basis of the adjustment signal that it receives from the comparator CMP1. That is, during time interval TI2, the track-and-hold control circuit THC1 adjusts resistor R2 so that it has a resistance for which the DC signal at the measurement input Mi of comparator CMP1 is substantially equal to the target value TV1. The track-and-hold control circuit THC1 maintains this resistance of resistor R2 after time interval TI2 until resistor R2 is adjusted anew. The adjustment circuit ADCT1 adjusts resistors R3 and R4 in a similar fashion during time intervals TI3 and TI4, respectively.

The stimulus signal source SSC1 can be controlled to provide an AC signal instead of a DC signal at a time subsequent to time T4E, which marks the end of the adjustment of the resistors R1, R2, R3, and R4 in the filter input section FS1 illustrated in FIG. 3. In that case, the basic switch SW1 within the adjustment circuit ADCT1 is switched to the open state. The capacitors C1, C2, C3, and C4 in the filter input section FS1 can then be adjusted in a fashion that is similar to the adjustment of the resistors R1, R2, R3, and R4 described hereinbefore.

Figure 6:
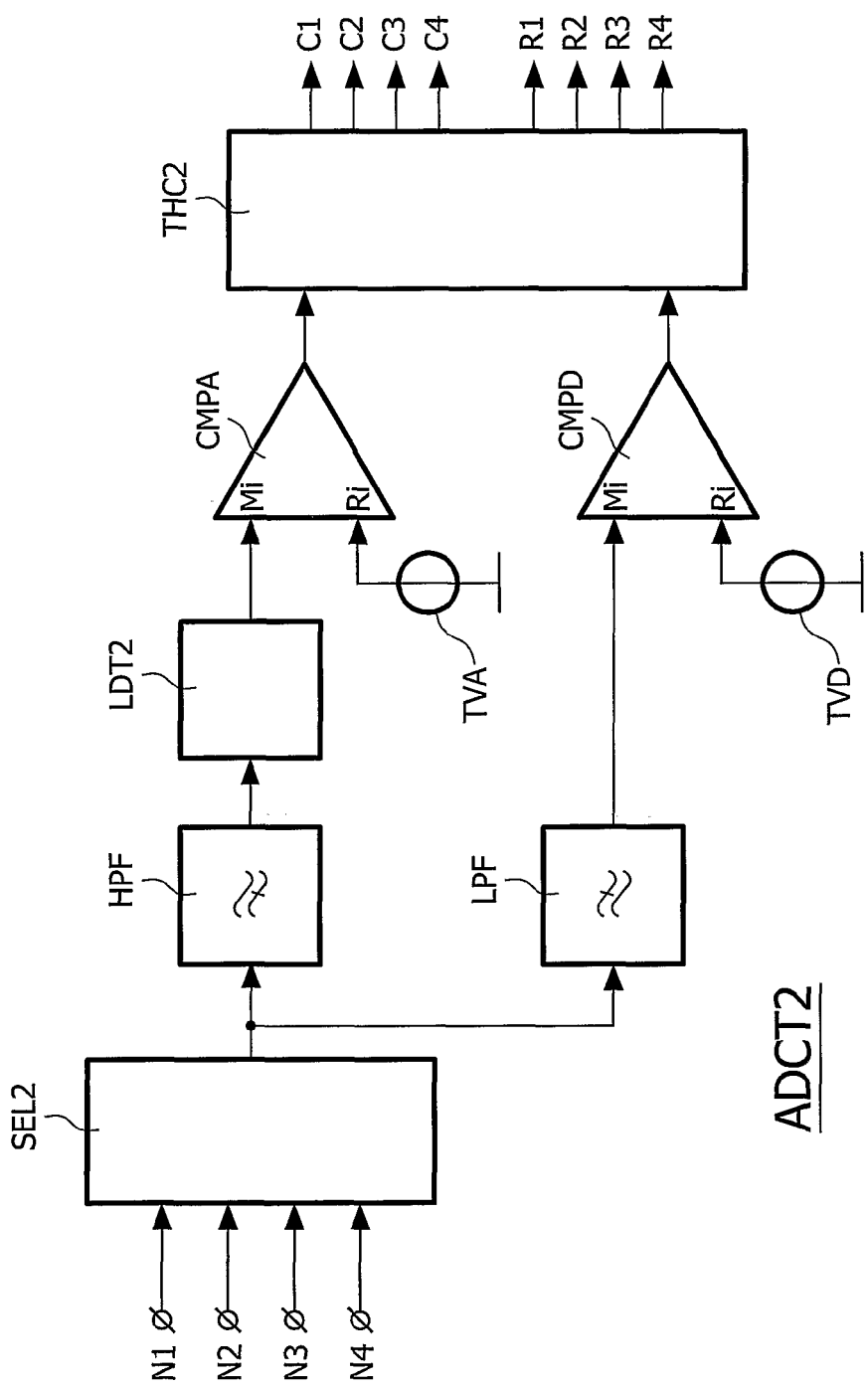
FIG. 6 is a circuit diagram that illustrates an alternative adjustment circuit for the filter input section.

FIG. 6 illustrates an alternative adjustment circuit ADCT2 for the filter input section FS1 illustrated in FIG. 3. The alternative adjustment circuit ADCT2 comprises a selector SEL2, a high pass filter HPF, a level detector LDT2, an AC branch comparator CMPA, a low pass filter LPF, a DC branch comparator CMPD, and a track-and-hold control circuit THC2. The selector SEL2 is similar to the selector SEL1 of the adjustment circuit ADCT1 illustrated in FIG. 4. The AC branch comparator CMPA and the DC branch comparator CMPD are similar to the comparator CMP1 of the adjustment circuit ADCT1 illustrated in FIG. 4. Each comparator CMPA, CMPD has a measurement input Mi and the reference input Ri. The AC branch comparator CMPA receives an AC branch target value TVA. The DC branch comparator CMPD receives a DC branch target value TVD.

The alternative adjustment circuit ADCT2 operates as follows. Let it be assumed that the stimulus signal source SSC1 provides a combination of a DC signal and an AC signal. In that case, a combination of a DC signal and an AC signal will be present on the measurement node N that the selector SEL2 has selected. The DC signal will depend on the resistor R coupled to the measurement node N that the selector SEL2 has selected. The AC signal will depend on the capacitor C coupled to the measurement node N that the selector SEL2 has selected. The low pass filter LPF and the high pass filter HPF in the alternative measurement circuit separate the DC signal and the AC signal.

The level detector LDT2 receives the AC signal. In response, the level detector LDT2 applies a level detection value, which depends on the AC signal, to the AC branch comparator CMPA. The AC branch comparator CMPA compares the level detection value with the AC branch target value TVA. A capacitor adjustment signal reflects the result of this comparison. The AC branch comparator CMPA applies the capacitor adjustment signal to the track-and-hold control circuit THC2. The track-and-hold control circuit THC2 adjusts the capacitor C that is coupled to the measurement node N that the selector SEL2 has selected, on the basis of the capacitor adjustment signal.

The DC branch comparator CMPD receives the DC signal. The DC branch comparator CMPD compares the DC signal with the DC branch target value TVD. A resistor adjustment signal reflects the result of this comparison. The DC branch comparator CMPD applies the resistor adjustment signal to the track-and-hold control circuit THC2. The track-and-hold control circuit THC2 adjusts the resistor R that is coupled to the measurement node N that the selector SEL2 has selected, on the basis of the resistor adjustment value. The track-and-hold control circuit THC2 adjusts the resistor R and the capacitor C simultaneously.

The alternative adjustment circuit ADCT2 illustrated in FIG. 6 allows an adjustment in a shorter period of time compared with the adjustment circuit ADCT1 illustrated in FIG. 4. Referring to FIG. 5, the adjustment circuit ADCT1 illustrated in FIG. 3 adjusts the resistors R1, R2, R3, and R4 in the time intervals TI1, TI2, TI3, and TI4, respectively, and needs four further time intervals to adjust the capacitors C1, C2, C3, and C4. In contradistinction, the alternative adjustment circuit ADCT2 illustrated in FIG. 6 can adjust the resistors as well as the capacitors within the time intervals illustrated in FIG. 5. The alternative adjustment circuit ADCT2 can effect the adjustment in a shorter period of time, because it comprises an AC signal and a DC signal branch.

Figure 7:
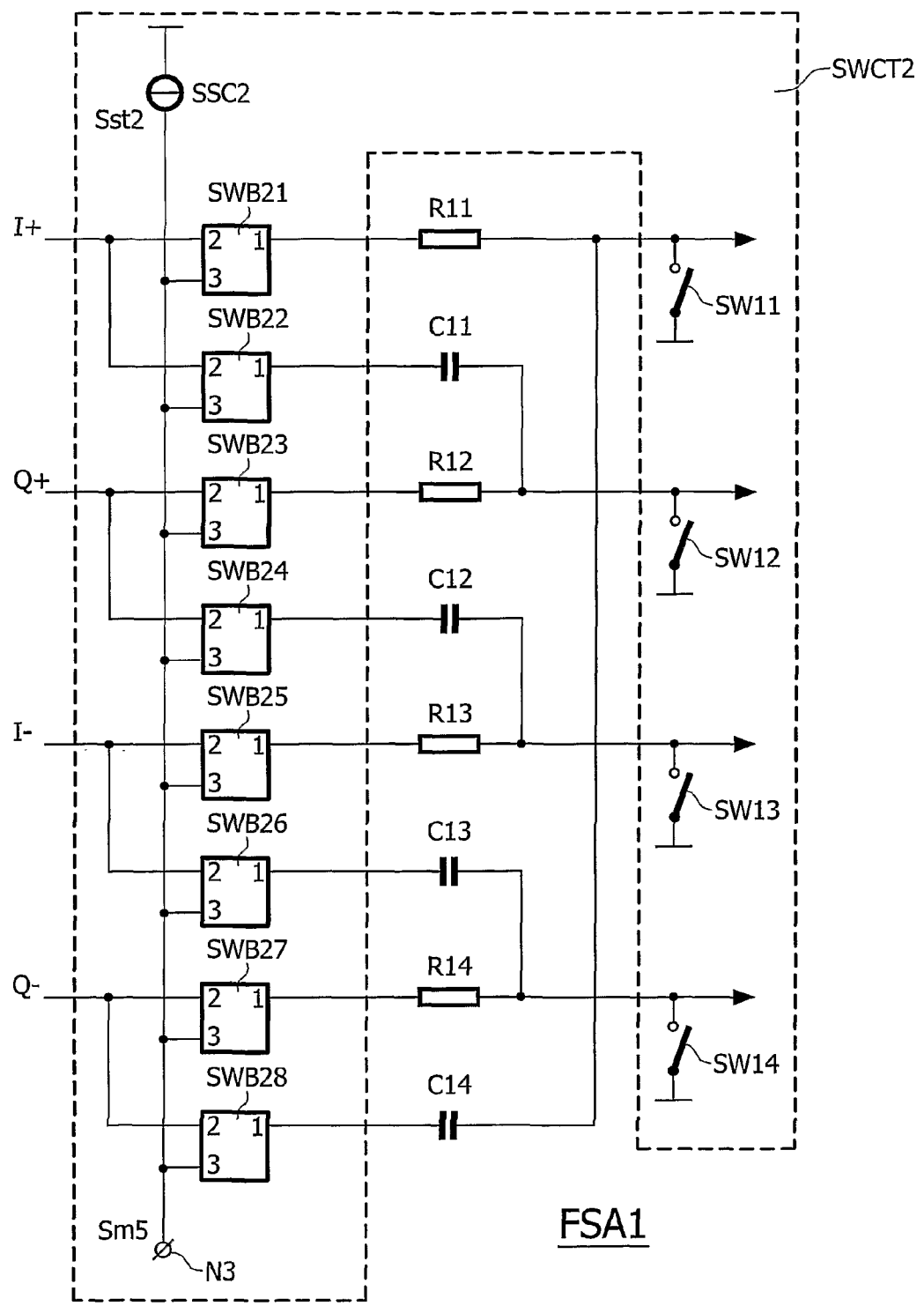
FIG. 7 is a circuit diagram that illustrates a first alternative filter input section for the polyphase filter.

FIG. 7 illustrates a first alternative filter input section FSA1 for the polyphase filter PPF illustrated in FIG. 2. The first alternative filter input section FSA1 comprises four resistors R11, R12, R13, and R14, and four capacitors C11, C12, C13, and C14, that constitute filter elements. The first alternative filter input section FSA1 further comprises a switching circuit SWCT2, which includes eight switch blocks SWB21, ..., SWB28, four basic switches SW11,... SW14, a stimulus signal source SSC2, and a measurement node N5. The stimulus signal source SSC2 provides a stimulus signal Sst2.

The eight switch blocks SWB21, ..., SWB28 are similar. A switch block SWB has three contacts designated by numerals 1, 2, and 3. A switch block SWB has two switch states: a filter switch state in which contact 1 is connected with contact 2, and a measurement switch state in which contact 1 is connected with contact 3. The switch blocks SWB21, ..., SWB28 are normally in the filter switch state and exceptionally in the measurement switch state. The four basic switches SW11, ...,SW14 can be switched between an open state and a closed state. The open state corresponds to the filter switch state, the closed state corresponds to the measurement switch state.

The first alternative filter input section FSA1 illustrated in FIG. 7 operates as follows. A measurement signal Sm5 will appear on the measurement node N5 if any of the switch blocks SWB is in the measurement switch state. Let it be assumed, that switch block SWB21 and basic switch SW11 are in the measurement switch state and that the other switch blocks and the other basic switches are in the filter switch state. In that case, resistor R11 receives the stimulus signal Sst2. The measurement signal Sm5 will have an amplitude that is defined, amongst of the things, by the stimulus signal source SSC2, and resistor R11.

Let it now be assumed, that switch blocks SWB28 and basic switch SW14 are the measurement switch state and that the other switch blocks and basic switches are in the filter switch state. In that case, capacitor C4 receives the stimulus signal Sst2. Now, the measurement signal Sm5 on the measurement node N5 will have an amplitude that is defined, amongst of the things, by the stimulus signal source SSC2 and capacitor C14. The first alternative filter input section FSA1 illustrated in FIG. 7 thus allows an individual measurement of the various filter elements. In contradistinction, in the filter input section FS1 illustrated in FIG. 3, a resistor and the capacitor will, in combination, determine the measurement signal on the measurement node N to which these filter elements are coupled.

Each of the eight switch blocks SWB21, ..., SWB28 is successively switched from the filter switch state to the measurement switch state. For example, let it be assumed that switch block SWB21 is switched from the filter switch state to the measurement switch state and then back again to the filter switch state. Subsequently, switch block SWB22 is switched from the measurement switch state to the filter switch state and then back again to the filter switch state. This switching process continues so that each of the switch blocks SWB21, ...,SWB28 is successively switched to the measurement switch state for an interval of time. Accordingly, each filter element will successively be coupled to the measurement node N5 and to the stimulus signal source SSC2. The basic switches SW11, ..., SW14 are switched so that the filter element that is coupled to the measurement node N5 and to the stimulus signal source SSC2, is coupled to signal ground. Accordingly, the measurement signal Sm5, which is present on the measurement node N5, will successively be determined by resistor R11, C11, R12, C12, etc.

Figure 8:
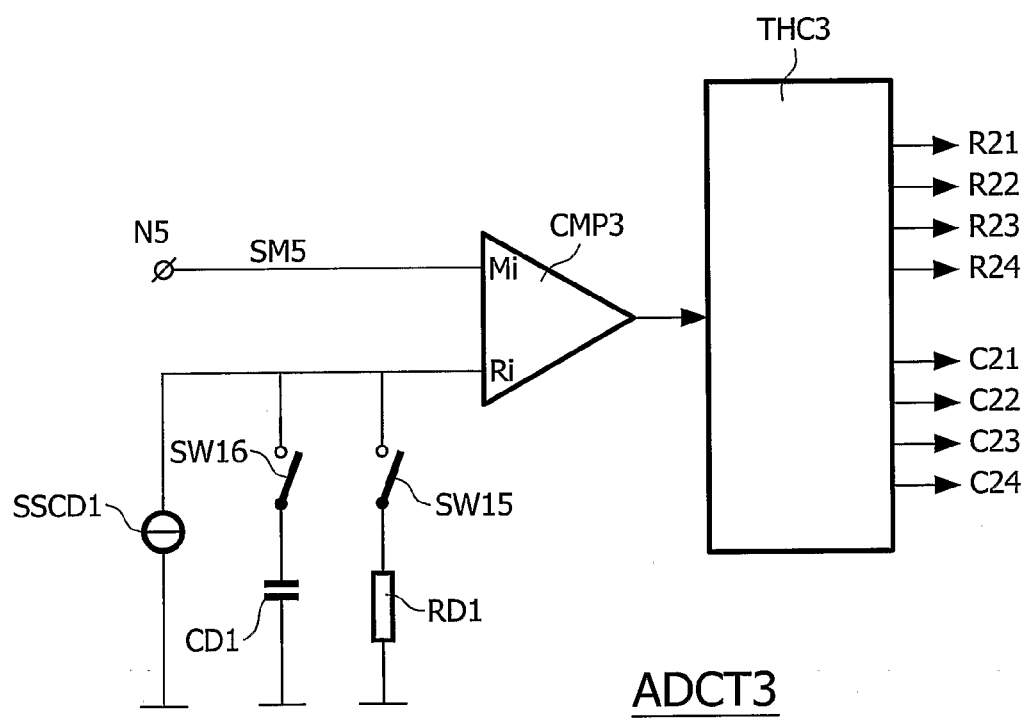
FIG. 8 is a circuit diagram that illustrates an adjustment circuit for the first alternative filter input section.

FIG. 8 illustrates an adjustment circuit ADCT3 for the first alternative filter input section FSA1 illustrated in FIG. 7. The adjustment circuit ADCT3 comprises a duplicated stimulus signal source SSCD1, a duplicated resistor RD1 connected in series with a basic switch SW15, a duplicated capacitor CD1 connected in series with a basic switch SW16, a comparator CMP3, and a track-and-hold control circuit THC3. The comparator CMP3 has a measurement input Mi and reference input Ri. The measurement input Mi receives the measurement signal Sm5 that this present on the measurement node N5 in the first alternative filter input section FSA1 illustrated in FIG. 7. The reference input Ri receives a signal which depends on the duplicated stimulus signal source SSCD1, the duplicated resistor RD1, the duplicated capacitor CD1, and the basic switches SW15, SW16 connected in series thereto. The duplicated stimulus signal source SSCD1 is similar to the stimulus signal source SSC2 in the first alternative filter input section FSA1 illustrated in FIG. 7. The duplicated resistor RD1 and the duplicated capacitor RD2 are similar to the resistors R and the capacitors C in the first alternative filter input section FSA1 illustrated in FIG. 7.

The adjustment circuit ADCT3 illustrated in FIG. 8 operates as follows. Let it be assumed that the measurement signal present at the measurement node N5 is determined by one of the four resistors R of the first alternative filter input section FSA1 illustrated in FIG. 7. In that case, the basic switch SW15 that is connected in series with the duplicated resistor RD1 is in a closed state. The basic switch SW16 that is connected in series with the duplicated capacitor RD1 is an open state.

Let it now be assumed that the measurement signal present at the measurement node N5 is determined by one of the four capacitors C of the first alternative filter input section FSA1 illustrated in FIG. 7. In that case, the basic switch SW16 that is connected in series with the duplicated capacitor CD1 is in a closed state. The basic switch SW15 that is connected in series with the duplicated resistor RD1 is an open state.

In either of the two cases described hereinbefore; the comparator CMP3 will receive at its reference input Ri a signal that is comparable to the measurement signal Sm5. The comparator CMP3 detects the difference between that signal and the measurement signal Sm5, if there is any difference. The comparator CMP3 applies a difference signal, which reflects the difference, to the track-and-hold control circuit THC3. The track-and-hold control circuit THC3 adjusts the filter element that determines the measurement signal Sm5 so as to minimize the difference between the measurement signal and the signal applied to reference input Ri of the comparator CMP3.

Figure 9:
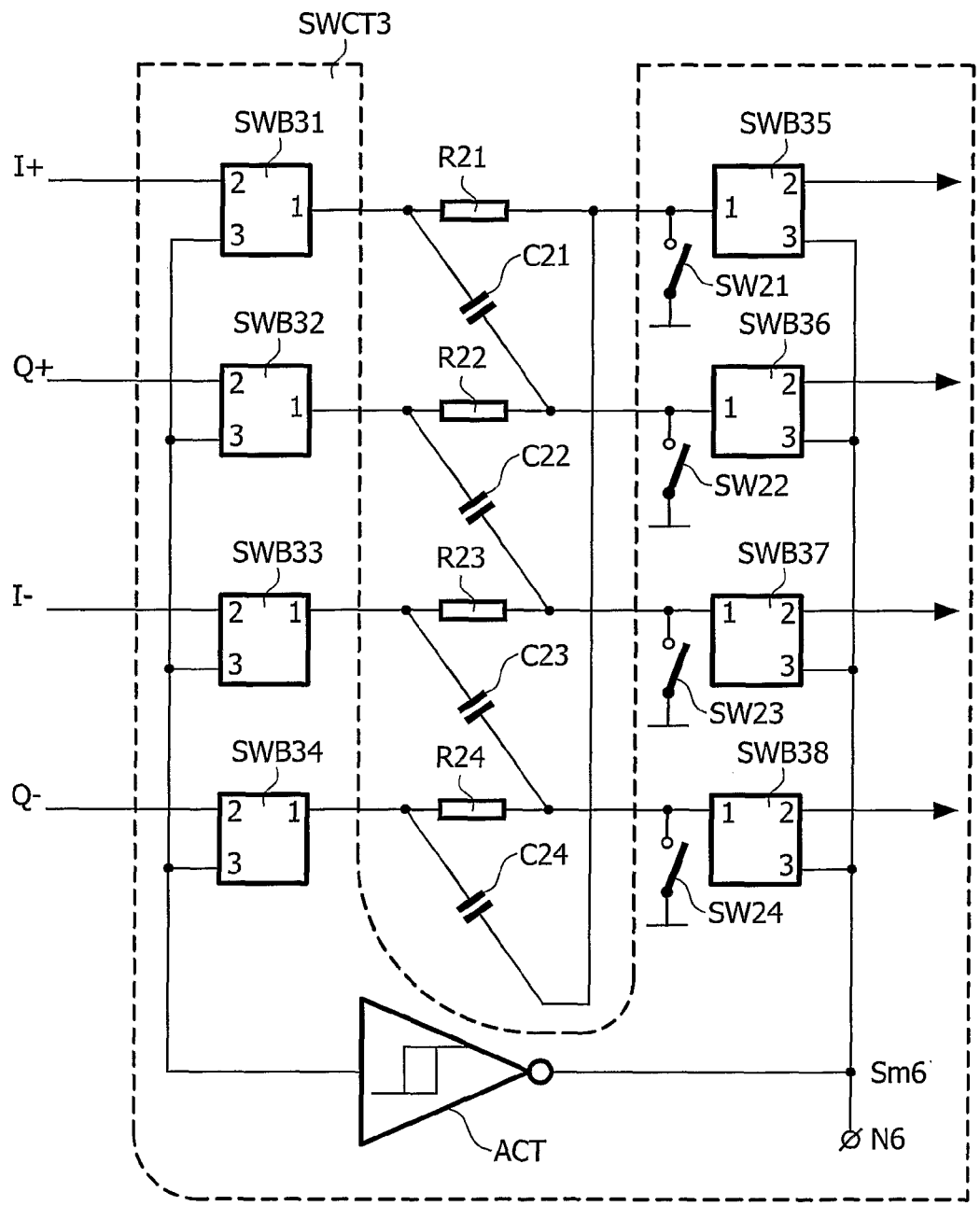
FIG. 9 is a circuit diagram that illustrates a second alternative filter input section for the polyphase filter.

FIG. 9 illustrates a second alternative filter input section FSA2. The second alternative filter input section FSA2 comprises four resistors R21, R22, R23, and R24, and four capacitors C21, C22, C23, and C24 that constitute filter elements. The second alternative filter input section FSA2 further comprises a switching circuit SWCT3, which includes eight switch blocks SWB31, . . . , SWB38, four basic switches SW21, . . . , SW24, an active circuit ACT, and a measurement node N6. The active circuit ACT is an amplifier that has a hysteresis. An oscillator circuit can be obtained when an RC circuit is coupled to such an amplifier.

The eight switch blocks SWB31, . . . , SWB38 are similar. A switch block SWB has three contacts designated by numerals 1, 2, and 3. A switch block SWB has two switch states: a filter switch state in which contact 1 is connected with contact 2, and a measurement switch state in which contact 1 is connected with contact 3. The switch blocks are normally in the filter switch state and exceptionally in the measurement switch state. The four basic switches SW21, . . . , SW24 can be switched between an open state and a closed state. The open state corresponds to the filter switch state; the closed state corresponds to the measurement switch state.

The second alternative filter input section FSA2 illustrated in FIG. 9 operates as follows. Let it be assumed that switch block SWB31 and switch block SWB35 are in the measurement switch state, whereas the other switch blocks are in the filter switch state. Let it further be assumed that basic switch SW22 is in the measurement switch state, whereas the other basic switches are in the filter switch state. In that case, the active circuit ACT, resistor R21, and capacitor C21 form an oscillator circuit that produces a measurement signal Sm6 at the measurement node N6.

Let it now be assumed that switch block SWB32 and switch block SWB36 are in the measurement switch state, whereas the other switch blocks are in the filter switch state. Let it further be assumed that basic switch SW23 is in the measurement switch state, whereas the other basic switches are in the filter switch state. In that case, the active circuit ACT, resistor R22, and capacitor C22, form an oscillator circuit that produces the measurement signal Sm6 at the measurement node.

In a similar fashion, resistor R23 and capacitor C23 form an oscillator circuit in combination with the active circuit ACT, when switch blocks SWB33 and SWB37, and basic switch SW24 are in the measurement switch state. Resistor R24 and capacitor C24 form an oscillator circuit in combination with the active circuit ACT, when switch blocks SWB34 and SWB38, and basic switch SW21 are in the measurement switch state. In either of the above described cases, the filter elements that, in combination with the active circuit ACT, constitute an oscillator circuit, determine the frequency of the measurement signal Sm6 at the measurement node N6.

Figure 10:
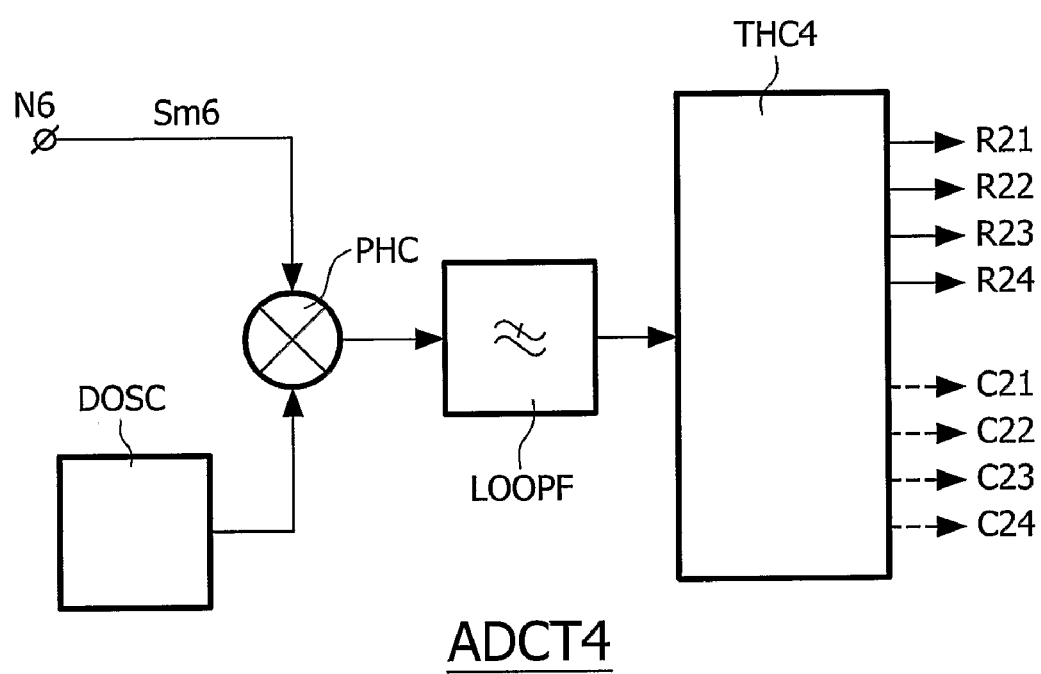
FIG. 10 is a circuit diagram that illustrates an adjustment circuit for the second alternative filter input section.

FIG. 10 illustrates an adjustment circuit ADCT4 for adjusting the filter elements in the second alternative filter input section FSA2 illustrated in FIG. 9. The adjustment circuit ADCT4 comprises a duplicated oscillator circuit DOSC, a phase comparator PHC, a loop filter LOOPF, and a track-and-hold control circuit THC4. The duplicated oscillator circuit DOSC has a structure that is similar to the structure of the oscillator circuit that is formed within the switching circuit SWCT3 as described hereinbefore. For example, the duplicated oscillator circuit DOSC may comprise an active circuit, a resistor, and the capacitor that are similar to the active circuit, the resistors and the capacitors, respectively, of the second alternative filter input section FSA2 illustrated in FIG. 9. The duplicated oscillator circuit DOSC produces a duplicated oscillator signal.

The adjustment circuit ADCT4 illustrated in FIG. 10 operates as follows. The phase comparator PHC receives the measurement signal Sm6 present at the measurement node N6 of the second alternative filter input section FSA2 illustrated in FIG. 9. The phase comparator PHC further receives the duplicated oscillator signal from the duplicated oscillator circuit DOSC. The phase comparator PHC compares the phase of the measurement signal with that of the duplicated oscillator signal so as to produce a phase error signal. The loop filter LOOPF filters the phase error signal so as to produce a control signal. The track-and-hold control circuit THC4 adjusts the resistor R that determines the frequency of the measurement signal Sm6 present at the measurement node N6 of the second alternative filter input section FSA2 illustrated in FIG. 9. The track-and-hold control circuit THC4 adjusts the resistor R so that the frequency of the measurement signal Sm6 is substantially equal to the frequency of the duplicated oscillator signal. Alternatively, the track-and-hold control circuit THC4 may adjusts the capacitor C that determines the frequency of the measurement signal. The track-and-hold control circuit THC4 may also adjusts both the resistor R and the capacitor C.

Figure 11:
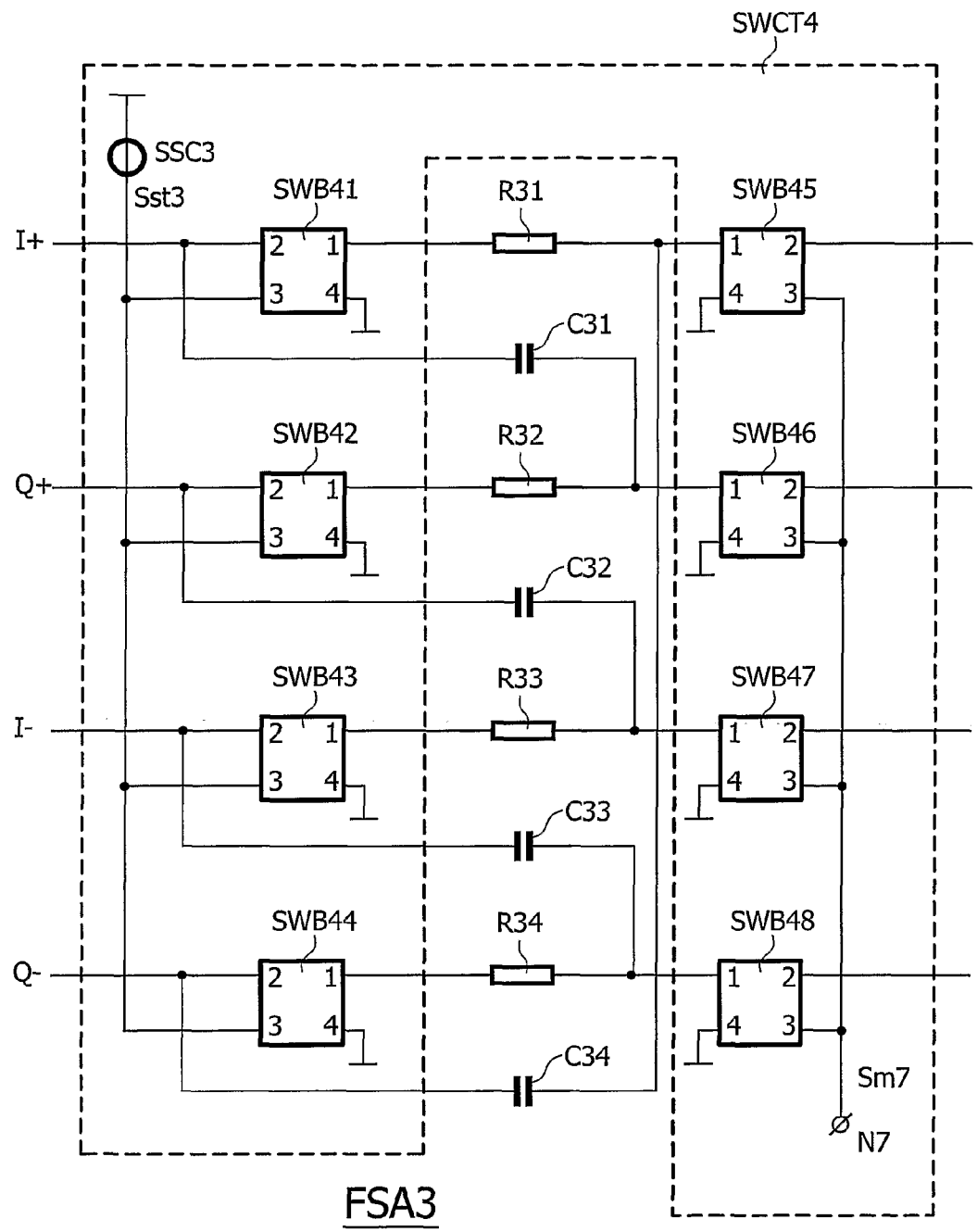
FIG. 11 is a circuit diagram that illustrates a third alternative filter input section for the polyphase filter.

FIG. 11 illustrates a third alternative filter input section FSA3. The third alternative filter input section FSA3 comprises four resistors R3 1, R32, R33, and R34, and four capacitors C31, C32, C33, and C34, that constitute filter elements. The third alternative filter input section FSA3 further comprises a switching circuit SWCT4, which includes eight switch blocks SWB41, . . . , SWB48, a stimulus signal source SSC3 and a measurement node N7. The stimulus signal source SSC3 provides a stimulus signal Sst3 in the form of an AC signal.

The eight switch blocks SWB41, . . . , SWB48 are similar. A switch block SWB has four contacts designated by numerals 1, 2, 3, and 4. A switch block SWB has two switch states: a filter switch state in which contact 1 is connected with contact 2, and a measurement switch state in which contact 1 is connected with contact 3 and contact 2 is connected with contact 4. The switch blocks are normally in the filter switch state and exceptionally in the measurement switch state.

The third alternative filter input section FSA3 illustrated in FIG. 11 operates as follows. Let it be assumed that switch blocks SWB41, SWB44, and SWB45 are in the measurement switch state. In that case, resistor R31 receives the stimulus signal Sst3 from the stimulus signal source SSC3. Resistor R31 and capacitor C34 constitute an RC network that provides a filtered stimulus signal. The filtered stimulus signal is present at the measurement node N7 and constitutes a measurement signal Sm7.

Let it now be assumed that switch blocks SWB41, SWB42, and SWB46 are in the measurement switch state. In that case, resistor R32 that receives the stimulus signal from the stimulus signal source SSC4. Resistor R32 and capacitor C31 constitute an RC network that provides a filtered stimulus signal. The filtered stimulus signal is present at the measurement node N7 and constitutes the measurement signal Sm7.

In a similar fashion, resistor R33 and capacitor C32 constitute an RC network that filters the stimulus signal when switch blocks SWB42, SWB43, and SWB47 are in the measurement switch state. Resistor R34 and capacitor C1 constitute an RC network that filters the stimulus signal when switch blocks SWB43, SWB44, and SWB48 are in the measurement switch state. In either of the above described cases, the filter elements that: constitute an RC circuit, which filters the stimulus signal, determine the amplitude and phase of the measurement signal Sm7 present at the measurement node N7.

Figure 12:
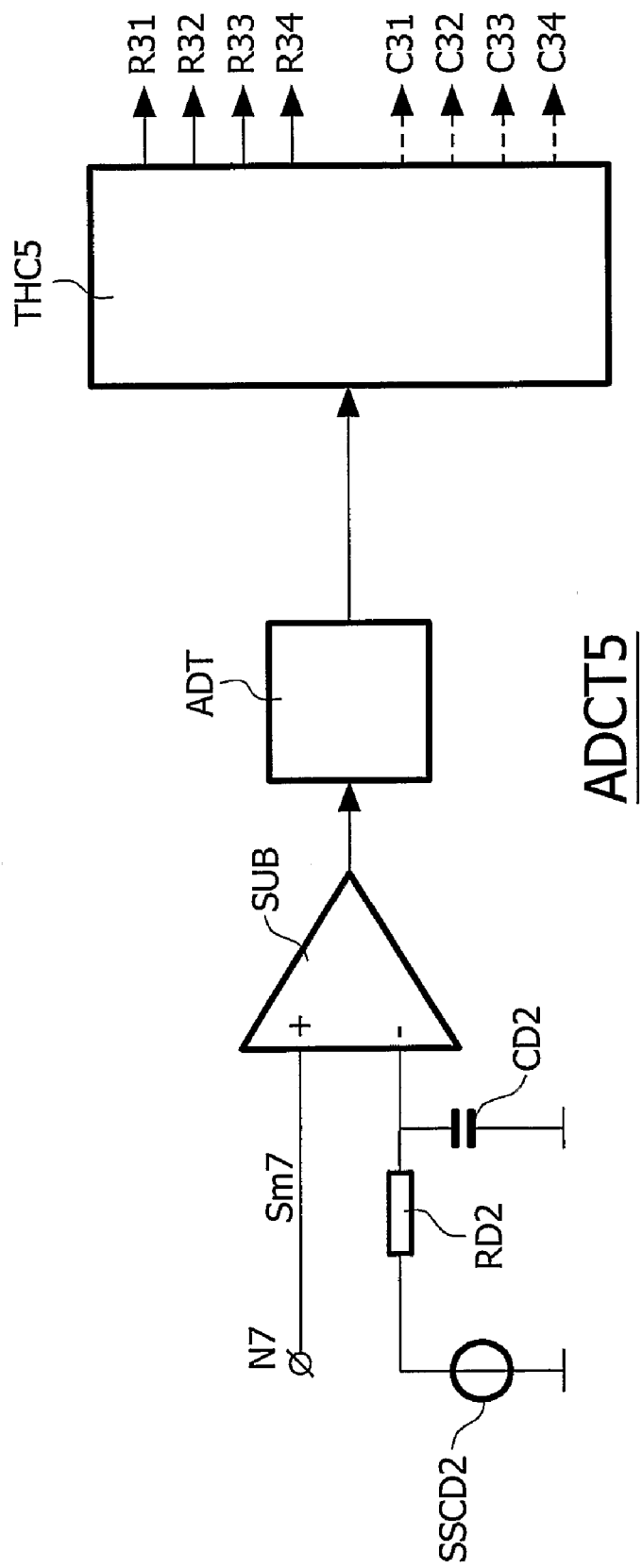
FIG. 12 is a circuit diagram that illustrates an adjustment circuit for the third alternative filter input section.

FIG. 12 illustrates an adjustment circuit ADCT5 for adjusting the filter elements in the third alternative filter input section FSA3 illustrated in FIG. 11. The adjustment circuit ADCT5 comprises a duplicated stimulus signal source SSCD2, a duplicated resistor RD2, a duplicated capacitor CD2, a subtractor SUB, and an amplitude detector ADT, and a track-and-hold control circuit THC5. The duplicated stimulus signal source SSCD2 provides an AC signal similar to the AC signal that the stimulus signal source SSC4 illustrated in FIG. 11 provides. The duplicated resistor RD2 and the duplicated capacitor CD2 are similar to the resistors R and the capacitors C, respectively, in the third alternative filter input section FSA3 illustrated in FIG. 11.

The adjustment circuit ADCT5 illustrated in FIG. 12 operates as follows. The subtractor SUB receives the measurement signal Sm7 at an input. The subtractor SUB further receives a comparison signal at another input. The comparison signal is determined by the duplicated stimulus signal source SSCD2, the duplicated resistor RD2, and the duplicated capacitor CD2. The subtractor SUB subtracts the measurement signal from the comparison signal so as to obtain a difference signal. The subtractor SUB applies the difference signal to the amplitude detector ADT. In response, the amplitude detector ADT provides an amplitude detection signal that is representative of the amplitude of the difference signal. The track-and-hold control circuit THC5 adjusts the resistor R that determines the measurement signal Sm7 so as to minimize the amplitude of the difference signal. The track-and-hold control circuit THC5 may also adjusts the capacitor C that determines the measurement signal, or may adjust both the resistor and the capacitor. For example, referring to FIG. 11, let it be assumed that switch blocks SWB41, SWB44, and SWB45 are in the measurement switch state. In that case, resistor R41 and capacitor C44 determine the measurement signal. The track-and-hold control circuit THC5 then adjusts resistor R41 or capacitor C44, or both.

The alternatives described hereinbefore have in common that the respective stimulus signal sources SSC may provide an AC signal. In such embodiments, it is preferable that the frequency of the AC signal lies in within a frequency range wherein the signal response characteristics of the filter element(s) to be controlled, significantly vary as a function of frequency. For example, if the filter elements to be controlled constitute an RC network, it is desirable that the frequency of the AC signal is approximately ½π RC, R being the resistance of the resistor, C being the capacitance of the capacitor.

Figure 13:
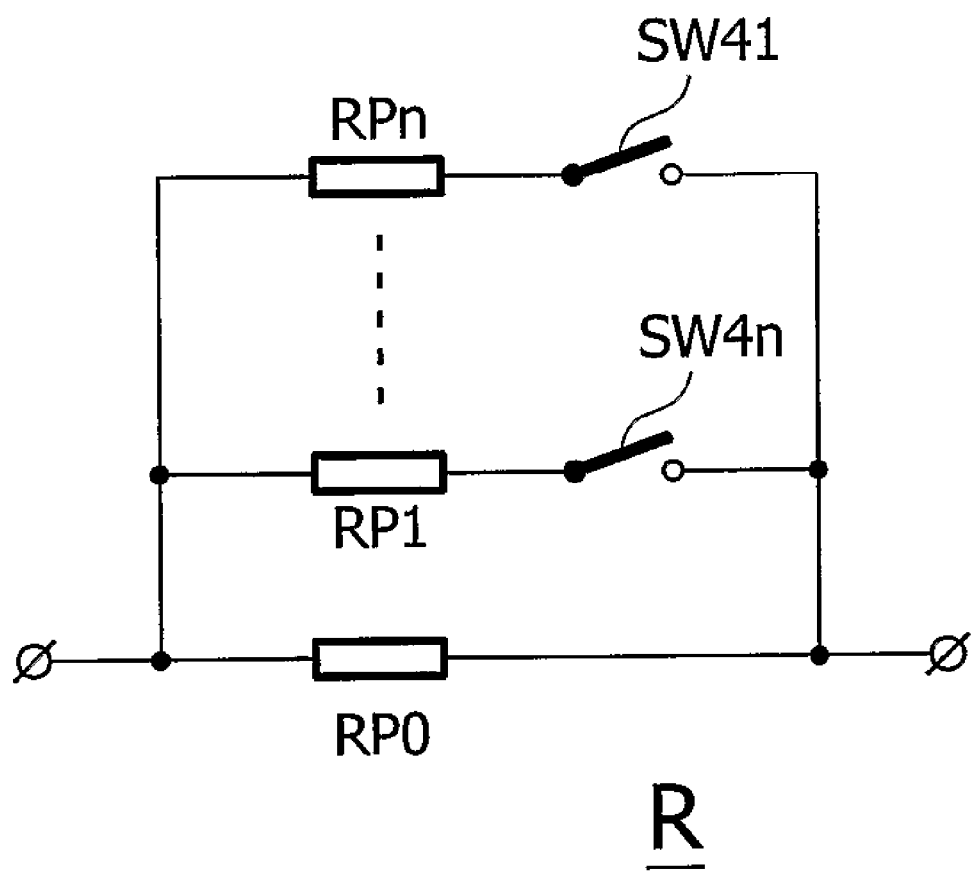
FIG. 13 illustrates a resistor for use as a filter element in the polyphase filter.

FIG. 13 illustrates an example of an implementation of a resistor R that constitutes a filter element in the embodiments described hereinbefore. The resistor R comprises a main resistor portion RPO, various auxiliary resistor portions RP1, . . . , RPn and various basic switches SW41 . . . SW4$n$. Each auxiliary resistor portion RP has a basic switch SW connected in series thereto. The basic switch SW can be an open state or in the closed state. Switching the basic switch SW from the open state to the closed state decreases the resistance of the resistor R to a certain extent. The decrease in resistance is determined by the resistance of the auxiliary resistor portion RP. A binary signal may control a basic switch SW. The binary signal may be derived from a digital control value. The respective track-and-hold control circuits THC in the embodiments described hereinbefore may provide such a digital control value. A capacitor C that constitutes a filter element may be implemented in a similar fashion: a main capacitor portion is coupled in parallel to a plurality of capacitors connected in series with basic switches.

In each of the embodiments described in before, the filter elements are adjusted so that the value of each filter element closely matches the respective values of the other filter elements of the same type. An advantage of such close matching is that the polyphase filter PPF, which forms part of the receiver REC illustrated in FIG. 1, suppresses unwanted signal to relatively great extent. In particular, the polyphase filter PPF provides a satisfactory suppression within a frequency band that is the negative frequency counterpart of the pass band that comprises positive frequencies. This contributes to the receiver REC providing a relatively good reception quality.

The switch blocks SWB, the basic switches SW, the selector SEL, and the track-and-hold control circuit THC in the embodiments described hereinbefore, may receive control signals, for example, from the controller CTRL in the receiver REC illustrated in FIG. 1. Alternatively, the polyphase filter PPF may comprise a dedicated filter controller that provides appropriate control signals. Such a dedicated filter controller may operate under the supervision of the controller CTRL in the receiver REC illustrated in FIG. 1. The dedicated filter controller may also operate independently. The controller CTRL and the dedicated filter controller, if any, may be in the form of a suitably programmed microprocessor.

In the embodiments described hereinbefore, all switches in the switching circuit SWCT are preferably in the filter switch state when the receiver REC receives a useful signal. There are various time intervals that are suitable for switching filter elements from a filter state to a measurement state and back again. For example, the operations illustrated in FIG. 5 may be carried out when the receiver REC illustrated in FIG. 1 undergoes an operational transition. A switching into operation of the receiver REC constitutes an operational transition. The switching into operation may be done via the controller CTRL. The controller CTRL can be programmed so that during a relatively short time interval following a switching into operation, the receiver REC does not provide the video signal VID to the display device DPL. Instead, the controller CTRL may control the polyphase filter PPF during that time interval so as to adjust the filter elements in accordance with any of the techniques described hereinbefore.

The switching of the receiver REC from one channel to another channel also constitutes an operational transition. Channel switching is preferably done via the controller CTRL. The controller CTRL can be programmed so that filter elements are switched and adjusted when channel switching occurs.

The radio frequency signal to be received may comprise time intervals that can be used to adjust the filter elements. The radio frequency signal may comprise, for example, a synchronization signal that has a relatively long duration. The receiver REC may relatively quickly detect the synchronization signal. There after, the controller CTRL may use what is left as duration of the synchronization signal to carry out the operations described hereinbefore with reference to the figures. The radio frequency signal may also be, for example, a time division multiplex signal comprising time slots which desired information and time slots with information that is not desired. The controller CTRL may use the latter time slots to adjust the filter elements in accordance with the techniques described hereinbefore.

CONCLUDING REMARKS

The detailed description hereinbefore with reference to the drawings illustrates the following characteristics. A signal processing arrangement (receiver REC) comprises a filter (polyphase filter PPF) with various filter elements (resistors R, capacitors C, RC circuits). A switching circuit (SWCT) switches a filter element and, subsequently, another filter element from a filter state to an adjustment state and back again to the filter state. A filter element that is in the filter state contributes to a suppression of unwanted signals. A filter element that is in the adjustment state affects a characteristic (amplitude, phase, frequency) of a measurement signal (Sm). An adjustment circuit (ADCT) adjusts the filter element that is in the adjustment state so that the characteristic of the measurement signal is substantially equal to a target value (TV).

The aforementioned characteristics can be implemented in numerous different manners. In order to illustrate this, some alternatives are briefly indicated. The signal processing arrangement may be, for example, an analog-to-digital converter that has an anti-aliasing filter. The filter may comprise, for example, various individual filter sections that need to closely match, each filter section filtering a different signal. In principle, the filter may comprise any number of filter elements; the 4 resistors and the 4 capacitors in the embodiments described hereinbefore are merely an example. The filter elements may comprise, for example, inductors or resonance circuits, or both. The term filter element should be understood in a broad sense: a filter element may be an individual electrical component or an assembly of electrical components such as, for example, an RC circuit or an LC circuit. The switching circuit and the adjustment circuit may, in principle, be combined with any other functional entity of the signal processing arrangement.

Furthermore, the specific embodiments in the detailed description hereinbefore with reference to the drawings can be implemented in numerous different manners. In order to illustrate this, some alternatives are briefly indicated. The polyphase filter PPF illustrated in FIG. 2 may be designed so as to suppress positive frequencies instead of negative frequencies. A resistor R may be implemented, for example, by means of a field effect transistor. Such a resistor can be adjusted by means of a control voltage that is applied to a gate of the field effect transistor. A capacitor C may be implemented, for example, by means of two layers of semi-conductor material, each layer having a different doping. Such a capacitor may be adjusted, for example, by means of a control voltage that is applied between the two layers. A switch block SWB may comprise, for example, various basic switches that need not necessarily be clustered. Each basic switch may be relatively distant from the other basic switches. Circuits that do not belong to the switch block may be present in between the respective basic switches.

There are numerous ways of implementing functions by means of items of hardware or software, or both. In this respect, the drawings are very diagrammatic, each representing only one possible embodiment of the invention. Thus, although a drawing shows different functions as different blocks, this by no means excludes that a single item of hardware or software carries out several functions. Nor does it exclude that an assembly of items of hardware or software or both carry out a function.

The remarks made hereinbefore demonstrate that the detailed description with reference to the drawings, illustrate rather than limit the invention. There are numerous alternatives, which fall within the scope of the appended claims. Any reference sign in a claim should not be construed as limiting the claim. The word "comprising" does not exclude the presence of other elements or steps than those listed in a claim. The word "a" or "an" preceding an element or step does not exclude the presence of a plurality of such elements or steps.

The invention claimed is:

1. A signal processing arrangement comprising a filter for suppressing unwanted signals, the filter comprising a plurality of filter elements characterized in that the signal processing arrangement comprises:
    a switching circuit for switching a first filter element of the plurality of filter elements and, subsequently, a second filter element of the plurality of filter elements from a filter state to an adjustment state and back again to the filter state, the first and second filter elements that are in the filter state contributing to the suppressing of unwanted signals, the first and second filter elements that are in the adjustment state affecting a characteristic of a measurement signal;
    an adjustment circuit for adjusting the first and second filter elements that are in the adjustment state so that the characteristic of the measurement signal is substantially equal to a target value; and
    a signal source for applying a stimulus signal to the first and second filter elements that are in the adjustment state, the first and second filter elements providing the measurement signal in response to the stimulus signal,
    wherein the signal source is arranged to provide a DC stimulus signal and an AC stimulus signal so as to obtain a DC measurement signal and an AC measurement signal, respectively,
    wherein the adjustment circuit being arranged to adjust the first filter element which constitutes a resistor based on the DC measurement signal, and to adjust the second filter element which constitutes a capacitor based on the AC measurement signal.

2. The signal processing arrangement as claimed in claim 1, wherein the signal source is arranged to simultaneously provide the DC stimulus signal and the AC stimulus signal, the adjustment circuit comprising a DC branch for adjusting the resistor and an AC branch for adjusting the capacitor.

3. The signal processing arrangement as claimed in claim 1, wherein the target value is derived from a duplicated circuit which is representative of the first and second filter elements that are in the adjustment state, the duplicated circuit receiving a duplicated signal, which is representative of the stimulus signal.

4. The signal processing arrangement as claimed in claim 1, wherein the signal processing arrangement comprises an oscillator circuit, the first and second filter elements that are switched to the adjustment state forming part of the oscillator circuit, an output signal of the oscillator circuit constituting the measurement signal.

5. The signal processing arrangement as claimed in claim 1, wherein the signal processing arrangement comprises a controller arranged to cause the switching circuit to successively switch first and second filter elements from the filter state to the adjustment state and then back again to the filter state, for an interval of time that coincides with an operational transition of the signal processing arrangement.

6. The signal processing arrangement as claimed in claim 1, wherein the signal processing arrangement comprises a controller that is arranged to detect an interval of time during which a desired signal is absent, and that is arranged to cause the switching circuit to successively switch first and second filter elements from the filter state to the adjustment state and then back again to the filter state within the interval of time.

7. The signal processing arrangement as claimed in claim 1, wherein the measurement signal has a frequency that lies in within a frequency range wherein the respective signal response characteristics of the respective first and second filter elements significantly vary as a function of frequency.

8. A method of processing a signal, the method comprising a filtering step in which unwanted signals are suppressed by means of a filter that comprises a plurality of filter elements, the method comprising:
a switching step in which a first filter element of the plurality of filter elements and, subsequently, a second filter element of the plurality of filter elements is switched from a filter state to an adjustment state and then back again to the filter state, the first and second filter elements that are in the filter state contributing to the suppressing of unwanted signals, the first and second filter elements that are in the adjustment state affecting a characteristic of a measurement signal;
applying a stimulus signal to the first and second filter elements that are in the adjustment state, the first and second filter elements providing the measurement signal in response to the stimulus signal, the stimulus signal simultaneously providing a DC stimulus signal and an AC stimulus signal, so as to obtain a DC measurement signal and an AC measurement signal; and
an adjustment step in which the first and second filter elements that are in the adjustment state is adjusted so that the characteristic of the measurement signal is substantially equal to a target value by adjusting the first filter element which constitutes a resistor based on the DC measurement signal, and adjusting the second filter element which constitutes a capacitor based on the AC measurement signal.

9. A signal display arrangement comprising a signal processing arrangement comprising a filter for suppressing unwanted signals, the filter comprising a plurality of filter elements characterized in that the signal processing arrangement comprises:
a switching circuit for switching a first filter element and, subsequently, a second filter element from a filter state to an adjustment state and back again to the filter state, the first and second filter elements that are in the filter state contributing to the suppressing of unwanted signals, the first and second filter elements that are in the adjustment state affecting a characteristic of a measurement signal;
an adjustment circuit for adjusting the first and second filter elements that are in the adjustment state so that the characteristic of the measurement signal is substantially equal to a target value;
a display device for displaying a signal that the signal processing arrangement has processed; and
a signal source for applying a stimulus signal to the first and second filter elements that are in the adjustment state, the first and second filter elements providing the measurement signal in response to the stimulus signal,
wherein the signal source is arranged to provide a DC stimulus signal and an AC stimulus signal so as to obtain a DC measurement signal and an AC measurement signal, respectively,
wherein the adjustment circuit being arranged to adjust the first filter element which constitutes a resistor based on the DC measurement signal, and to adjust the second filter element which constitutes a capacitor based on the AC measurement signal.

\* \* \* \* \*